United States Patent
Strzalkowski et al.

(10) Patent No.: US 7,843,237 B2
(45) Date of Patent: Nov. 30, 2010

(54) CIRCUIT ARRANGEMENT FOR ACTUATING A TRANSISTOR

(75) Inventors: Bernhard Strzalkowski, Munich (DE); Marco Seibt, Villach (AT); Uwe Kirchner, Feldkirchen (AT)

(73) Assignee: Infineon Technologies Austria AG, Villach (AT)

( * ) Notice: Subject to any disclaimer, the term of this patent is extended or adjusted under 35 U.S.C. 154(b) by 86 days.

(21) Appl. No.: 12/272,097

(22) Filed: Nov. 17, 2008

(65) Prior Publication Data

US 2010/0123511 A1     May 20, 2010

(51) Int. Cl.
*H03K 3/00* (2006.01)
(52) U.S. Cl. .................. 327/108; 327/112; 327/390
(58) Field of Classification Search ......... 327/108–112, 327/390
See application file for complete search history.

(56) References Cited

U.S. PATENT DOCUMENTS

| | | | | |
|---|---|---|---|---|
| 5,502,632 A | * | 3/1996 | Warmerdam et al. | 363/98 |
| 5,543,740 A | * | 8/1996 | Wong | 327/108 |
| 5,552,731 A | * | 9/1996 | Diazzi et al. | 327/109 |
| 6,538,481 B1 | * | 3/2003 | Suetsugu | 327/109 |
| 6,646,469 B2 | * | 11/2003 | Yushan | 326/83 |
| 6,664,822 B2 | * | 12/2003 | Watabe | 327/108 |
| 6,781,423 B1 | * | 8/2004 | Knoedgen | 327/110 |
| 6,927,662 B2 | | 8/2005 | Kahlmann et al. | |
| 7,064,598 B2 | * | 6/2006 | Willingham et al. | 327/333 |

OTHER PUBLICATIONS

Horowitz, P., et al., "The Art of Electronics," Diodes and Diode Circuits, pp. 47 and 48, The Press Syndicate of the University of Cambridge, Cambridge, United Kingdom.
Pylarinos, L., et al., "Charge Pumps: An Overview," IEEE, date unknown, 7 pages.
Park, S., et al., "A Self-Boost Charge Pump Topology for a Gate Drive High-Side Power Supply," IEEE Transaction on Power Electronics, Mar. 2005, pp. 300-307, vol. 20, No. 2.

* cited by examiner

*Primary Examiner*—Kenneth B. Wells
(74) *Attorney, Agent, or Firm*—Slater & Matsil, L.L.P.

(57) ABSTRACT

One example of the invention relates to a circuit arrangement for actuating a high-side transistor which includes a control terminal and a load terminal. The circuit arrangement includes a driver circuit that is designed to generate, in response to a control signal, a driver signal for the control terminal of the high-side transistor. A supply circuit is capacitively coupled to a radio-frequency signal source and is designed to provide a supply voltage to the driver circuit, the supply voltage being referenced to a floating reference potential.

24 Claims, 3 Drawing Sheets

CIRCUIT ARRANGEMENT FOR ACTUATING A TRANSISTOR

TECHNICAL FIELD

Embodiments of the invention relate to a circuit arrangement for actuating a transistor comprising a driver circuit for actuating a high-side transistor and a power supply circuit for providing a supply voltage to the driver circuit.

BACKGROUND

Loads are frequently switched using what are known as high-side switches which are connected between the load and a circuit node which is at operating voltage. The load is therefore connected between the high-side switch and a circuit node which is at reference potential (usually ground). High-side switches are often used in preference to low-side switches connected between reference potential and load because, when high-side switches are used, the operating voltage is not applied to the load when they are in the off state. Often, transistor half-bridges comprising a low-side switching transistor and a high-side switching transistor are also used for switching loads, such as in power converters.

Suitable switches are, in principle, all kinds of transistors and thyristors. In the field of the power electronics, power MOSFETs and IGBTs are used as switching transistors. In contrast to logic circuits, where transistor half-bridges are frequently manufactured in CMOS technologies, NMOS transistors are preferred for switching loads in power due to their lower turn-on resistance.

However, actuating the high-side transistor in pure NMOS (and also in NPN bipolar) half-bridges requires a voltage which is higher than the operating voltage of the half-bridge and of the load, respectively. For this reason, driver circuits require a dedicated power supply for actuating high-side semiconductor switches. This can be provided, by way of example, by a capacitor which is charged via a diode when the high-side switch is off. Such an arrangement comprising a capacitor and a diode for supplying power to the floating (free of ground) driver circuit is also called a bootstrap circuit.

However, one problem is that such circuit arrangements comprising a high-side switch, a driver circuit for actuating the high-side switch and a bootstrap circuit for providing supply voltage to the driver are not capable of keeping the high-side switch in an on-state for as long as desired, since the capacitor is discharged by a current consumption, albeit a low one, in the driver circuit. Particularly in very-large-scale-integrated circuits, it is a complex matter to manufacture capacitors of appropriate size, and therefore the possible turned-on time of a high-side switch is limited by the size of the capacitor and the current consumption of the driver circuit.

However, there are applications in which the limited turned-on time of high-side switches is troublesome, and there is a need for high-side switches which can be kept in an on-state for an arbitrarily long time. Circuits are known which ensure that the driver circuit of the high-side switch is supplied with power permanently, e.g., with the aid of DC/DC converters. Such circuit arrangements are usually very complex, however. There is therefore also a need for a simple and inexpensive circuit for permanently supplying power to driver circuits for high-side switches.

SUMMARY OF THE INVENTION

One example of the invention relates to a circuit arrangement for actuating a high-side transistor which comprises a control terminal and a load terminal; the circuit arrangement comprises: a driver circuit that is designed to generate, in response to a control signal, a driver signal for the control terminal of the high-side transistor; a radio-frequency signal source; a supply circuit which is capacitively coupled to the radio-frequency signal source and which is designed to provide a supply voltage to the driver circuit, the supply voltage being referenced to a floating reference potential.

BRIEF DESCRIPTION OF THE DRAWINGS

The following figures and the rest of the description are intended to assist better understanding of the invention. The elements in the figures are not necessarily intended to be understood as a restriction, but rather emphasis is placed on presenting the principles of the invention. In the figures, identical reference symbols denote corresponding parts.

DETAILED DESCRIPTION OF ILLUSTRATIVE EMBODIMENTS

As described above, driver circuits for actuating high-side transistors require a power supply, where the supply voltage for the driver circuit referenced to a fixed reference potential $V_{SS}$ (e.g., ground) is higher than the operating voltage of the load to be switched when the high-side transistor is in the on-state. However, the supply voltage is not referenced to the fixed reference potential $V_{SS}$, but rather to the load connection of the high-side switching transistor which faces the load. In the case of an N-channel MOSFET as the high-side switch, this is the source connection, and in the case of an NPN bipolar transistor or an N-channel IGBT it is the emitter connection. The potential of the load connection (i.e., source potential or emitter potential) is thus the ground-free reference potential for the driver circuit "from the point of view" of the high-side transistor or its driver circuit. This ground-free reference potential $V_{REFHS}$ is approximately the same as the fixed reference potential $V_{SS}$ when the high-side switch is in the off-state, and it is approximately the same as the operating voltage $V_{DD}$ of the load when the high-side switch is in the on-state. This approximation applies when the voltage drop when the transistor is in the on-state is negligibly small in comparison with the operating voltage of the load.

Figure 1:
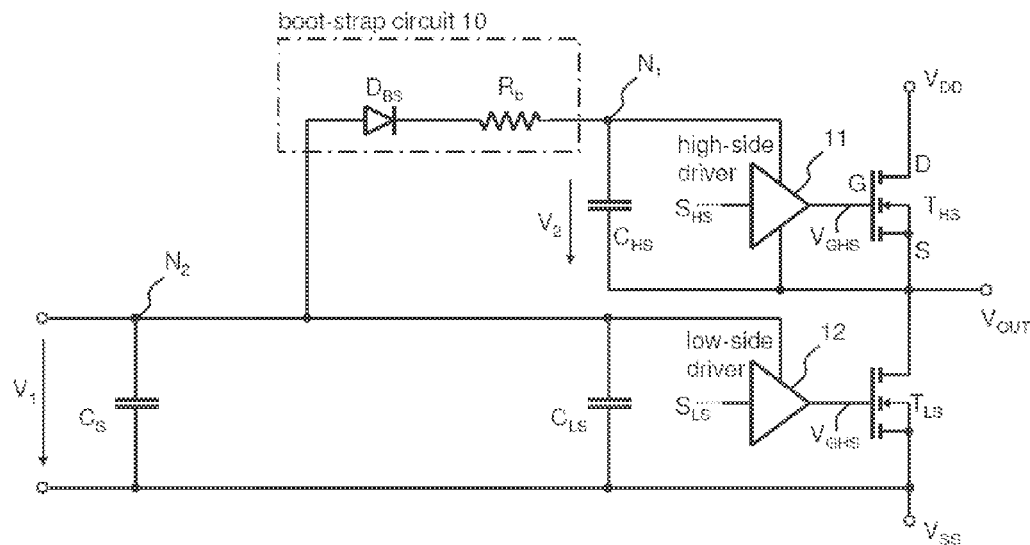
FIG. 1 shows a diagram of a transistor half-bridge comprising a high-side transistor and a low-side transistor with a respective driver circuit, wherein the driver circuit for the high-side transistor is supplied with power by a bootstrap circuit which comprises a diode and a capacitor.

A good example of what has been described above is shown in FIG. 1. FIG. 1 is a diagram of a circuit arrangement comprising a half-bridge with a high-side switch $T_{HS}$ and a low-side switch $T_{LS}$, two driver circuits (high-side driver 11 and low-side driver 12) for actuating the transistor switches $T_{HS}$ and $T_{LS}$, a voltage source which provides a DC supply voltage $V_1$ for supplying power to the driver circuit 12, and a bootstrap circuit 10 for supplying power to the driver circuit 11. The driver circuits 11 and 12 are connected to the respective control connections of the associated transistors $T_{HS}$, $T_{LS}$ and are designed to take a control signal $S_{HS}$ or $S_{LS}$ as a basis for turning the respective transistor $T_{HS}$ or $T_{LS}$ on or off. The supply voltage for the high-side driver 11 is denoted by $V_2$, and that for the low-side driver 12 is denoted by $V_1$.

In the case illustrated, the high-side transistor $T_{HS}$ is an NMOS transistor with a gate connection as control connection G and with a drain connection D and a source connection S as load connections. To actuate the high-side MOS transistor $T_{HS}$, the driver circuit 11 needs to produce a gate voltage of several volts referenced to the potential of the source connection S (which is equal to the ground-free reference potential $V_{REFHS}$). When the high-side transistor $T_{HS}$ is on, the gate voltage $V_{GHS}$, referenced to the fixed reference potential $V_{SS}$ (e.g., ground), is then higher than the operating voltage $V_{DD}$ of the load. Since the level of the gate voltage referenced to the source potential $V_{REFHS}$ is relevant to the high-side transistor $T_{HS}$, i.e., the gate/source voltage $V_{GHS}-V_{REFHS}$, the supply voltage $V_2$ for the high-side driver 11 is also referenced to the ground-free reference potential $V_{REFHS}$. In contrast to this, the supply voltage $V_1$ for the low-side driver 12 is referenced to the fixed reference potential $V_{SS}$. The supply voltage $V_1$ is provided by an external voltage source, and the supply voltage $V_2$ is provided by a capacitor $C_{HS}$ which is charged by means of the bootstrap circuit 10. To this end, the capacitor $C_{HS}$ is connected firstly to the high-side driver 11 at a circuit node $N_1$ and secondly to the source connection S of the high-side transistor $T_{HS}$, that is to say to the ground-free reference potential $V_{REFHS}$. In order to charge the capacitor $C_{HS}$, the bootstrap circuit 10 comprises a diode $D_{BS}$ which is connected between the capacitor $C_{HS}$ (at the circuit node $N_1$) and a connection for the supply voltage $V_1$ (at a circuit node $N_2$) for the low-side driver 12 such that the capacitor $C_{HS}$ is charged via the diode $D_{BS}$ when the high-side switch $T_{HS}$ is in an off-state (and the low-side switch $T_{LS}$ is on) and therefore the ground-free reference potential $V_{REFHS}$ is approximately the same as the fixed reference potential $V_{SS}$ (e.g., ground). To limit the charging current for the capacitor $C_{HS}$, a resistor $R_b$ may also be connected in series with the diode $D_{BS}$. In addition, a Zener diode (not shown) may be connected in parallel with the capacitor $C_{HS}$ in order to limit the capacitor voltage on the capacitor $C_{HS}$.

When the high-side transistor $T_{HS}$ is in the on-state, the capacitor $C_{HS}$ is prevented from being discharged by the diode $D_{BS}$, so that the capacitor $C_{HS}$ can provide the supply voltage $V_2$ for the high-side driver 11.

However, the capacitor $C_{HS}$ is nevertheless discharged on account of the current consumption of the high-side driver 11 and on account of leakage currents. It is obvious that when the circuit arrangement shown in FIG. 1 is used, the turned-on time of the high-side switch $T_{HS}$ is likewise limited by the limited capacitance of the capacitor $C_{HS}$.

Figure 2:
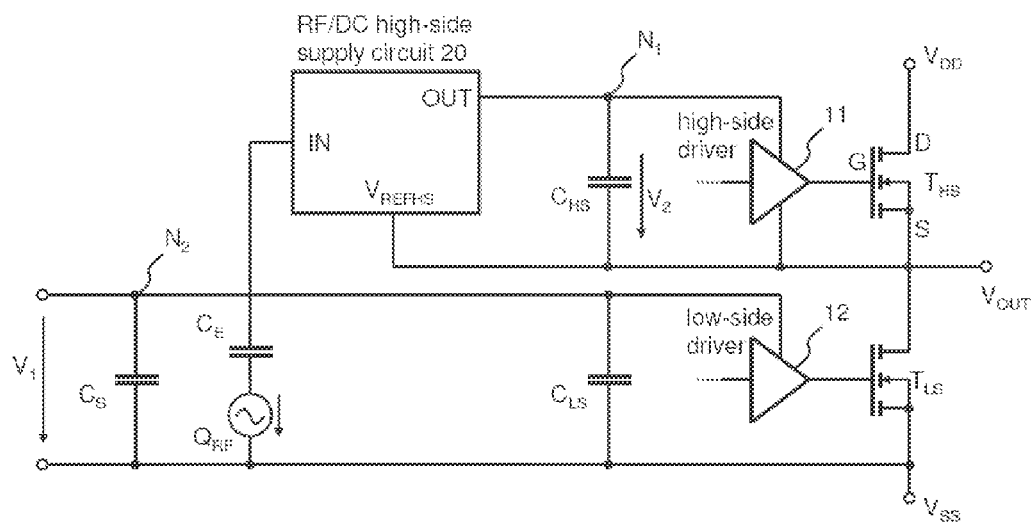
FIG. 2 shows a diagram of a circuit arrangement with a transistor half-bridge, driver circuits for the transistors, a radio-frequency signal source and a power supply circuit which is capacitively coupled thereto and which ensures a permanent supply of power for the high-side driver circuit.

A circuit arrangement which is improved over the circuit arrangement described in FIG. 1 is shown in FIG. 2.

The circuit arrangement from FIG. 2 essentially corresponds to the circuit arrangement from FIG. 1, but in line with a first example of the invention the bootstrap circuit 10 is replaced by a high-side power supply circuit 20 which is capacitively coupled to a radio-frequency signal source $Q_{RF}$. The aforementioned capacitive coupling is provided by means of a capacitor $C_E$ which is connected between the power supply circuit 20 and the radio-frequency signal source $Q_{RF}$. The radio-frequency signal source $Q_{RF}$ is operated at the fixed reference potential $V_{SS}$ (that is to say at the "low signal" of the circuit arrangement) and produces a radio-frequency current signal which is supplied to the power supply circuit 20 (which is situated on the "high side" of the circuit arrangement) via the capacitor $C_E$. The capacitor $C_E$ decouples the DC supply voltage $V_1$ on the "low side" from the ground-free DC supply voltage $V_2$ on the "high side", but allows a radio-frequency flow of current (and hence a flow of power) between the two circuit parts.

The power supply circuit 20 is designed to rectify the radio-frequency signal which is produced by the radio-frequency signal source 20 and capacitively coupled into the circuit 20 and to use the rectified radio-frequency signal to charge the capacitor $C_{HS}$. This prevents the capacitor $C_{HS}$ from being discharged and ensures that the high-side driver 11 is permanently supplied with power. This is made possible because the capacitor $C_{HS}$ allows a (radio-frequency) flow of current and hence power from the "low side" to the "high side" of the circuit arrangement regardless of the absolute value of the ground-free ("floating") reference potential $V_{REFHS}$.

Figure 3:
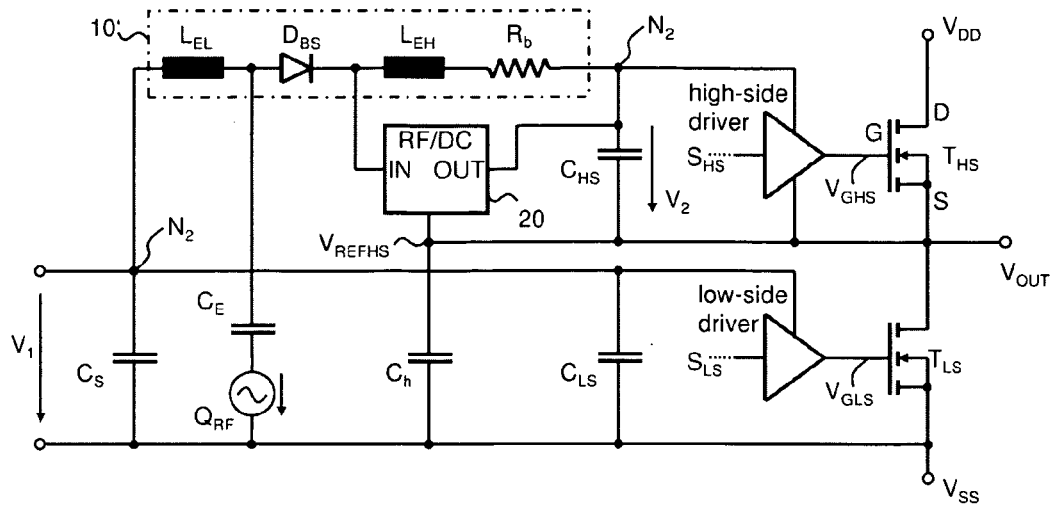
FIG. 3 shows a diagram of the circuit arrangement from FIG. 2 in more detail.

FIG. 3 shows a diagram of a further example of a circuit arrangement according to an embodiment of the invention. The circuit arrangement from FIG. 3 essentially corresponds to the circuit arrangement from FIG. 2. In comparison with the circuit arrangement from FIG. 2, the circuit arrangement from FIG. 3 comprises an additional bootstrap circuit 10'. The bootstrap circuit 10' comprises not only the diode $D_{BS}$ and the optional series resistor $R_b$ (see FIG. 1: bootstrap circuit 10) but also, additionally, inductive components $L_{EL}$ and $L_{EH}$ which are connected to the power supply circuit 20, to the high-side driver 11 and to the connection of the supply voltage $V_1$ for the low-side driver (i.e., to the circuit node $N_2$) such that the radio-frequency signal is decoupled from the DC supply voltages $V_1$ and $V_2$.

In contrast to the circuit arrangement from FIG. 2, the coupling capacitor $C_E$ is not connected to the power supply circuit 20 directly, but rather the diode $D_{BS}$ is also connected between the capacitor $C_E$ and the power supply circuit 20. The capacitive coupling between the radio-frequency signal source $Q_{RF}$ and the power supply circuit 20 is thus provided by means of the coupling capacitor $C_E$ and by means of the junction capacitance of the diode $D_{BS}$. In the present arrangement, the diode $D_{BS}$ performs a dual function. Firstly, the diode $D_{BS}$, as a component of the bootstrap circuit 10', serves to charge the capacitor $C_{HS}$ when the high-side transistor $T_{HS}$ is off (and the low-side transistor is on). Secondly, the diode $D_{BS}$ also serves to capacitively couple the radio-frequency signal to the power supply circuit 20 by means of its junction capacitance.

The coupling capacitor $C_E$ and the junction capacitance of the diode $D_{BS}$ can be used to supply the high-side driver 11 permanently with power and to allow the high-side transistor $T_{HS}$ to remain permanently on, even if the diode $D_{BS}$ is reverse-biased in this case. To achieve the capacitive coupling, it would suffice to connect the coupling capacitor $C_E$ directly to the power supply circuit 20. In this case, the coupling capacitor $C_E$ would need to be high-voltage resistant, however, since the total operating voltage $V_{DD}-V_{SS}$ of the half-bridge in this case is present across the capacitor $C_E$. However, a high-voltage capacitor is too expensive and has excessive geometric dimensions for many applications. Furthermore, the output of the radio-frequency signal source $Q_{RF}$ would at least briefly (when the half-bridge is switched) need to be able to accept the full operating voltage $V_{DD}-V_{SS}$ without being damaged. Such a radio-frequency signal source $Q_{RF}$ can also be implemented in an integrated circuit only with very great complexity, however.

The series circuit comprising the coupling capacitor $C_E$ and the diode $D_{BS}$ ensures sufficient capacitive coupling of the radio-frequency signal to the power supply circuit 20 if the junction capacitance of the diode $D_{BS}$ is high enough. Furthermore, the high voltage (operating voltage $V_{DD}$–$V_{SS}$) can readily be accepted by the diode, and the coupling capacitor $C_E$ can be in the form of a low-voltage capacitor which can also be integrated on a chip. In addition, it is possible to use a simple radio-frequency signal source $Q_{RF}$ which is not resistant to high voltage.

Diode types which are frequently used for such applications are MUR160 or UF1007, for example, which may have junction capacitances of about 4 pF to about 10 pF, in some cases even up to about 20 pF, which is sufficient for the inventive purpose when the radio-frequency signal source $Q_{RF}$ has frequencies of between approximately 20 MHz and 200 MHz. To decouple the radio-frequency signal from the DC supply voltage $V_1$, the coupling capacitor $C_E$ and the circuit node $N_2$ to which the supply voltage $V_1$ is applied have a coil $L_{EL}$ connected between them. This may be integrated in or on a chip as a flat coil, for example, as described in U.S. Pat. No. 6,927,662. To decouple the radio-frequency signal and the DC supply voltage $V_2$, the input of the power supply circuit 20 and the high-side driver 11 (circuit node $N_1$) have a further coil $L_{EL}$ connected between them which can likewise be integrated on a chip in microtransformer technology. The coils are intended to have inductance values of approximately 1 µH to 10 µH and may also be implemented on a PCB board as planar coils.

The circuit is closed to the RF signal by means of the drain/source (or collector/emitter) capacitances of the low-side transistor $T_{LS}$. To increase this capacitance, a further capacitor $C_h$ may be connected in parallel with the load path of the low-side transistor $T_{LS}$.

Figure 4:
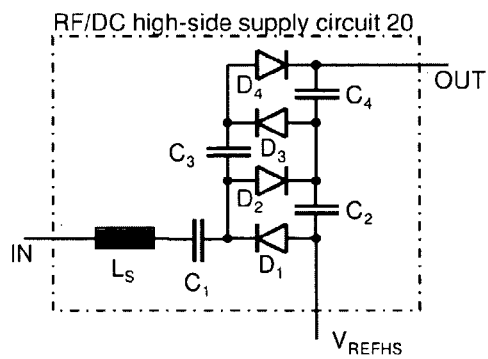
FIG. 4 shows a diagram of an example of a power supply circuit with a series resonant circuit for use in the circuit arrangement from FIG. 3.
Figure 5:
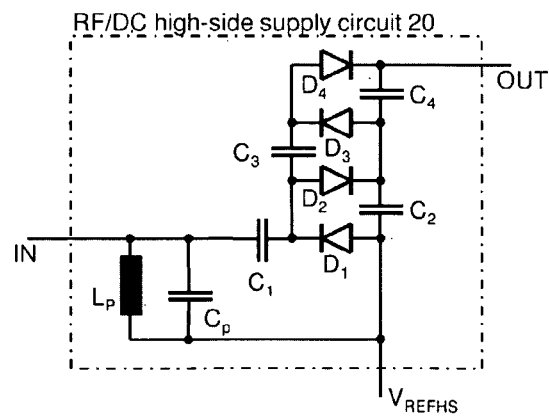
FIG. 5 shows a diagram of an example of a power supply circuit with a parallel resonant circuit for use in the circuit arrangement from FIG. 3.

FIG. 4 and FIG. 5 show examples of the power supply circuit 20 as may be used in the circuit arrangements from FIG. 2 or FIG. 3, for example. FIG. 4 illustrates a simple voltage multiplier circuit, also called Villard cascades. The voltage multiplier circuit comprises two cascades which each double the voltage. The first cascade comprises the capacitors $C_1$ and $C_2$ and the diodes $D_1$ and $D_2$, and the second cascade comprises the capacitors $C_3$ and $C_4$ and the diodes $D_3$ and $D_4$. In the present case, the voltage is thus multiplied by four, and any number of cascades can be strung together to achieve different voltage multipliers. Voltage multipliers are described briefly in Horowitz, Hill: The Art of Electronics, 2nd Edition, Cambridge University Press, pp. 47f, for example. To achieve the best possible impedance matching of the power supply circuit 20 to the radio-frequency signal source $Q_{RF}$, the input of the power supply circuit 20 has a coil $L_S$ connected in series with the capacitor $C_1$ of the first Villard cascade. The capacitor $C_1$ and the coil $L_S$ therefore form a series resonant circuit whose resonant frequency is in tune with the frequency of the radio-frequency signal.

The power supply circuit 20 from FIG. 5 essentially corresponds to the voltage multiplier circuit from FIG. 4, with a parallel resonant circuit comprising a capacitor $C_P$ and a coil $L_P$ being connected to the first Villard cascade instead of the series resonant circuit at the input of the power supply circuit 20. The coils can be easily integrated on a silicon chip using the aforementioned microtransformer technology.

Figure 6:
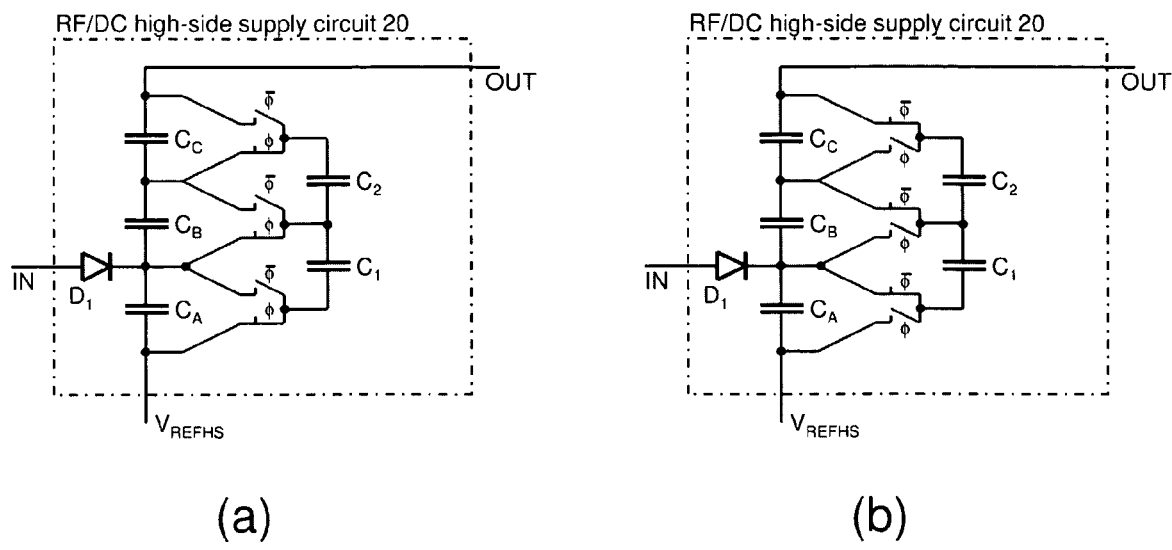
FIGS. 6a and 6b show diagrams of an example of a power supply circuit with a charge pump.

An alternative to the Villard cascades shown in FIGS. 4 and 5 is shown in FIGS. 6a and 6b, collectively FIG. 6. The power supply circuit 20 shown in FIG. 6 comprises not only a diode $D_1$ as rectifier element but also a charge pump, which in the configuration shown is also referred to as a Cockcroft-Walton voltage multiplier. An overview of charge pump circuits can be found in Louie Pylarinos, Charge Pumps: An Overview, Edward S. Rogers Sr. Department of Electrical and Computer Engineering, University of Toronto, for example.

The Cockcroft-Walton circuit shown in FIG. 6 comprises three series-connected capacitors $C_A$, $C_B$ and $C_C$ with the same respective capacitance C. The capacitor $C_A$ is connected to the input connection IN of the power supply circuit 20 via the rectifier diode $D_1$ and to the ground-free reference potential $V_{REFHS}$. The entire series circuit comprising the three capacitors is connected between the output and the ground-free reference potential. Switches can be used to transfer the charge stored in the capacitor $C_A$ to a further capacitor $C_1$ and therefrom in turn to the capacitor $C_B$. In the same way, the switches are used to "pump" the charge from the capacitor $C_B$ via a capacitor $C_2$ to the capacitor $C_C$.

The Boolean variables $\phi$ and $\bar{\phi}$ (i.e., NOT $\phi$) show the switching state of the individual switches. FIG. 6a shows a first switching state ($\phi$=1) in which charge is transferred from the capacitor $C_A$ to the capacitor $C_1$ and from the capacitor $C_B$ to the capacitor $C_2$. FIG. 6b shows a second switching state ($\phi$=0) in which charge is transferred from the capacitor $C_1$ to the capacitor $C_B$ and from the capacitor $C_2$ to the capacitor $C_C$. It can easily be appreciated that after a few switching cycles the voltage, referenced to the ground-free reference potential $V_{REFHS}$, at the output OUT of the power supply circuit 20 is three times the voltage at the input IN.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement for actuating a high-side transistor that comprises a control terminal and a load terminal, the circuit arrangement comprising:
   a driver circuit that is designed to generate, in response to a control signal, a driver signal for the control terminal of the high-side transistor,
   a radio-frequency signal source; and
   a supply circuit capacitively coupled to the radio-frequency signal source and which is designed to provide at an output a supply voltage to the driver circuit, the supply voltage being referenced to a floating reference potential, wherein one circuit node, that is at the floating reference potential, and a further circuit node, which has a constant reference potential, have a capacitor connected between them for closing a current path to the radio-frequency signal source.

2. The circuit arrangement as claimed in claim 1, wherein the capacitive coupling between the radio-frequency signal source and the supply circuit is provided by a junction capacitance of a diode.

3. The circuit arrangement as claimed in claim 2, wherein the supply circuit has an input, wherein the input of the supply circuit and the radio-frequency signal source are connected via the diode.

4. The circuit arrangement as claimed in claim 3, wherein the junction capacitance of the diode is between 5 pF and 30 pF.

5. The circuit arrangement as claimed in claim 3, wherein the input of the supply circuit and the radio-frequency signal source have a first capacitor connected between them in series with the diode.

6. The circuit arrangement as claimed in claim 2, further comprising a first inductive component coupled between the input and an output of the supply circuit.

7. The circuit arrangement as claimed in claim 6, further comprising a second inductive component coupled between the input of the supply circuit and a circuit node which has a constant operating voltage in reference to a constant reference potential.

8. The circuit arrangement as claimed in claim 1, wherein the supply circuit comprises at least one Villard cascade for doubling voltage.

9. The circuit arrangement as claimed in claim 8, wherein the supply circuit has a parallel resonant circuit comprising a first inductance and a first capacitor at an input.

10. The circuit arrangement as claimed in claim 8, in which the supply circuit has a series resonant circuit comprising a first inductance and a first capacitor at an input.

11. The circuit arrangement as claimed in claim 1, in which the supply circuit comprises at least one charge pump.

12. The circuit arrangement as claimed in claim 1, wherein the capacitor comprises a drain-source capacitance of a transistor.

13. A circuit comprising:
a radio-frequency signal source;
a driver circuit including an output to be coupled to a control terminal of a high-side transistor; and
a supply circuit with an input that is capacitively coupled to an output of the radio-frequency signal source and with an output that is coupled to a supply voltage input of the driver circuit, the supply voltage being referenced to a floating reference potential, wherein the supply circuit comprises at least one Villard cascade for doubling voltage.

14. The circuit as claimed in claim 13, further comprising a diode coupled between the output of the radio-frequency signal source and the input of the supply circuit, wherein the capacitive coupling between the radio-frequency signal source and the supply circuit is provided by a junction capacitance of the diode.

15. The circuit as claimed in claim 14, wherein the junction capacitance of the diode is between 5 pF and 30 pF.

16. The circuit as claimed in claim 14, further comprising a second capacitor coupled between the input of the supply circuit and the output of the radio-frequency signal source, the second capacitor coupled in series with the diode.

17. The circuit as claimed in claim 16, further comprising a first inductive component coupled between the input of the supply circuit and the output of the supply circuit.

18. The circuit as claimed in claim 17, further comprising a second inductive component coupled between the input of the supply circuit and a circuit node that has a constant operating voltage in reference to a constant reference potential.

19. The circuit as claimed in claim 13, further comprising the high-side transistor, the output of the driver circuit being coupled to the control terminal of the high-side transistor.

20. The circuit as claimed in claim 13, wherein the supply circuit comprises a parallel resonant circuit comprising a first inductance and a first capacitor at the input.

21. The circuit as claimed in claim 13, wherein the supply circuit comprises a series resonant circuit comprising a first inductance and a first capacitor at the input.

22. A circuit arrangement for actuating a high-side transistor that comprises a control terminal and a load terminal, the circuit arrangement comprising:
a driver circuit generating a driver signal for the control terminal of the high-side transistor in response to a control signal;
a radio-frequency signal source; and
a supply circuit configured to be capacitively coupled to a radio-frequency signal source the supply circuit providing a supply voltage to the driver circuit, the supply voltage being referenced to a floating reference potential, wherein one circuit node, that is at the floating reference potential, and a further circuit node, which has a constant reference potential, have a capacitance connected between them for closing a current path to the radio-frequency signal source.

23. The circuit arrangement as claimed in claim 22, wherein the capacitance comprises a drain-source capacitance of a transistor.

24. The circuit arrangement as claimed in claim 22, wherein the capacitance comprises a capacitor.

* * * * *